United States Patent
Tierney et al.

(10) Patent No.: US 11,074,374 B2
(45) Date of Patent: Jul. 27, 2021

(54) METHOD AND APPARATUS FOR CHECKING CONSTRUCTABILITY OF A BUILDING INFORMATION MODEL

(71) Applicant: Katerra, Inc., Menlo Park, CA (US)

(72) Inventors: Patrick Tierney, San Francisco, CA (US); Abhijit Oak, Orinda, CA (US)

(73) Assignee: Katerra, Inc., Menlo Park, CA (US)

(*) Notice: Subject to any disclaimer, the term of this patent is extended or adjusted under 35 U.S.C. 154(b) by 756 days.

(21) Appl. No.: 15/815,193

(22) Filed: Dec. 20, 2017

(65) Prior Publication Data
US 2018/0276319 A1 Sep. 27, 2018

Related U.S. Application Data

(60) Provisional application No. 62/475,047, filed on Mar. 22, 2017.

(51) Int. Cl.
*G06F 30/13* (2020.01)
*G06F 16/903* (2019.01)

(52) U.S. Cl.
CPC ........ *G06F 30/13* (2020.01); *G06F 16/90335* (2019.01)

(58) Field of Classification Search
CPC ............................ G06F 16/90335; G06F 30/13
See application file for complete search history.

(56) References Cited

U.S. PATENT DOCUMENTS

| 2009/0125283 A1 | 5/2009 | Conover |
| 2011/0213480 A1 | 9/2011 | Zila et al. |

(Continued)

FOREIGN PATENT DOCUMENTS

| CN | 105023201 A | 11/2015 | |
| EP | WO2008004892 | * 1/2008 | ............. G06T 17/10 |

OTHER PUBLICATIONS

Utiome et al. "An Approach for Extending Building Information Models (BIM) to Specifications" [retrieved on Jul. 24, 2020], Retreived from researchgate.com. (Year: 2013).*

(Continued)

*Primary Examiner* — Rehana Perveen
*Assistant Examiner* — Alfred B Wechselberger
(74) *Attorney, Agent, or Firm* — Elliott, Ostrander & Preston, P.C.

(57) ABSTRACT

A system for determining constructability of a building project comprises a processor to execute software instructions, a storage device accessible by the processor in which to store a database, the database to store therein a building products information model (PIM), the PIM comprising a first plurality of building products, the database further to store therein a building information model (BIM) for the building project, wherein the BIM comprises a second plurality of building products. A user interface (UI) via receives input from a user and transmits output to a user according to software instructions executed by the processor. In one embodiment, software instructions executed by the processor cause the system to receive input from a user via the UI to select the BIM, search the PIM for at least one of the second plurality of building products in the BIM, and replace the at least one of the second plurality of building products in the BIM with one or more of the first plurality of building products in the PIM, responsive to the search of the PIM.

13 Claims, 8 Drawing Sheets

(56) References Cited

U.S. PATENT DOCUMENTS

| | | | |
|---|---|---|---|
| 2014/0180996 A1 | 6/2014 | Kulusjarvi et al. | |
| 2015/0234377 A1* | 8/2015 | Mizikovsky | G06F 30/13 700/98 |
| 2020/0057829 A1* | 2/2020 | Skoropinski | H04L 67/10 |

OTHER PUBLICATIONS

Khalili, A. "An IFC-Based Framework for Optimizing Level of Prefabrication in Industrialized Building Systems" [Thesis] National University of Singapore, Dept of Civil and Env. Eng. [retrieved on Jul. 29, 2020], Retrieved from <https://core.ac.uk/download/pdf/48677992.pdf> (Year: 2013).*

Baumgartel et al. "Automatic ontology-based Green Building Design Parameter Variation and Evaluation in Thermal Energy Building Performance Analyses" [retrieved on Jul. 30, 2020], Retrieved from researchgate.com. (Year: 2016).*

Eastman et al. "A generic building product model incorporating building type information" Automation in Construction, vol. 3, pp. 283-304 [retrieved on Jul. 25, 2020], Retrieved from <https://www.sciencedirect.com/science/article/pii/092658059400028L> (Year: 1995).*

Khalili, A., et al., "IFC-Based Framework to Move Beyond Individual Building Elements Toward Configuring a Higher Level of Prefabrication," Journal of Computing in Civil Engineering, May/Jun. 2013; vol. 27, Issue 3 pp. 243-253, American Society of Civil Engineers, US.

Schwabe, K., et al., "BIM Applications of Rule-Based Checking in Construction Site Layout Planning Tasks," 33rd International Symposium on Automation and Robotics in Construction, 2016, vol. 33, Abstract, p. 1, Department of Civil and Environmental Engineering, Ruhr-Universität Bochum, Germany and RAPIDS Laboratory, Ettlingen, Germany.

Alireza Khalili and David K.H. Chua, "IFC-Based Framework to Move Beyond Individual Building Elements Toward Configuring a Higher Level of Prefabrication," Journal of Computing in Civil Engineering, May/Jun. 2013; vol. 27, p. 243, American Society of Civil Engineers, US.

K. Schwabe, M. König, J. Teizer, "BIM Applications of Rule-Based Checking in Construction Site Layout Planning Tasks," 33rd International Symposium on Automation and Robotics in Construction, 2016, Abstract, p. 1, Department of Civil and Environmental Engineering, Ruhr-Universität Bochum, Germany and RAPIDS Laboratory, Ettlingen, Germany.

* cited by examiner

METHOD AND APPARATUS FOR CHECKING CONSTRUCTABILITY OF A BUILDING INFORMATION MODEL

RELATED APPLICATIONS

This application claims the benefit of the filing date of U.S. provisional patent application No. 62/475,047, filed Mar. 22, 2017, entitled "Feasibility checking of a building information model", the entire contents of which are incorporated by reference under 37 C.F.R. § 1.57.

TECHNICAL FIELD

Embodiments of the invention relate to a system for determining constructability of a building project. In particular, the embodiments check the feasibility of incorporating building elements or products into a building project by checking and modifying, if needed, elements in a building information model (BIM) of the building project.

BACKGROUND

Architects, designers, and other building professionals often do not know if their designs can actually be manufactured or built within a particular budget, schedule, and available manufacturing methods. This may seem like a trivial problem for a design professional, but that is only true in a general case when there are no requirements for the means, methods, and building details. In other words, a design professional may know that a building contractor will be able to produce a building with the same specifications set forth in their Building Information Model (BIM), but it is assumed that the contractor will make decisions concerning materials, manufacturing techniques, and detailing.

Heretofore, this process primarily has been done manually. Starting from a concept or schematic design, level of detail is added to a BIM until it is fully specified with parts that can be manufactured. These manufactured products are then extracted from a model along with rationale for manufacturing, material sourcing, transportation, and installation. Any errors at this step of rationalization are communicated back to the original designers and architects.

Tools such as those available from MiTek Systems, of San Diego, Calif., automatically, and with configuration, increase the level of detail of a building wall, determining which types of lumber, in which location, with which cuts, and should be manufactured on which machine, should be inserted into a BIM. Other tools such as Inventor, 3D CAD software available from Autodesk, Inc., of San Rafael, Calif., have the ability to publish Engineer to Order (ETO) models, which limit the design space to only include manufacture-able, transportable, and install-able designs. Sourcing considerations are not incorporated into the system.

The structural engineering software SDS/2 by Nemetschek, of Munich, Germany, formerly Design Data Corporation, of Mount Joy, Pa., takes a low level of detail BIM, and automatically replaces components of the BIM with manufacture-able, transportable, and install-able parts, limiting part selection to parts which can be manufactured with a set of captured Computer Numerical Control (CNC) machines. These machines, such as ones designed by Ficep Corporation, of Forest Hill, Md., and Peddinghaus Corporation, of Bradley, Ill., have a captured set of constraints, which are optimized around using the SDS/2 software system.

The Autodesk Model Checker for Revit and Autodesk Model Review both provide checks for a BIM. They analyze the model labels, annotations, and parameters against a set of BIM standards defined by the user, and may also check the geometry of a model to be within established BIM conventions. These tools are different from the embodiments of the invention set forth in the detailed description below in two ways. First, while these tools check the model standards, they do not check whether the BIM can be manufactured, transported, and installed within the constraints for a particular manufacturing, construction, and logistics system. So, while they may evaluate the geometry of the model (for instance checking that the sequence of floors is in a predefined order, or that a door is contained inside of a wall), they do not evaluate the geometry as it applies to building construction. Second, while these prior art systems require a fully annotated BIM, embodiments of the invention described herein do not necessarily require such. Embodiments may automatically increase the level of detail of the model as needed.

BRIEF DESCRIPTION OF THE DRAWINGS

Embodiments are illustrated by way of example, and not by way of limitation, and can be more fully understood with reference to the following detailed description when considered in connection with the figures in which.

DETAILED DESCRIPTION

Figure 1:
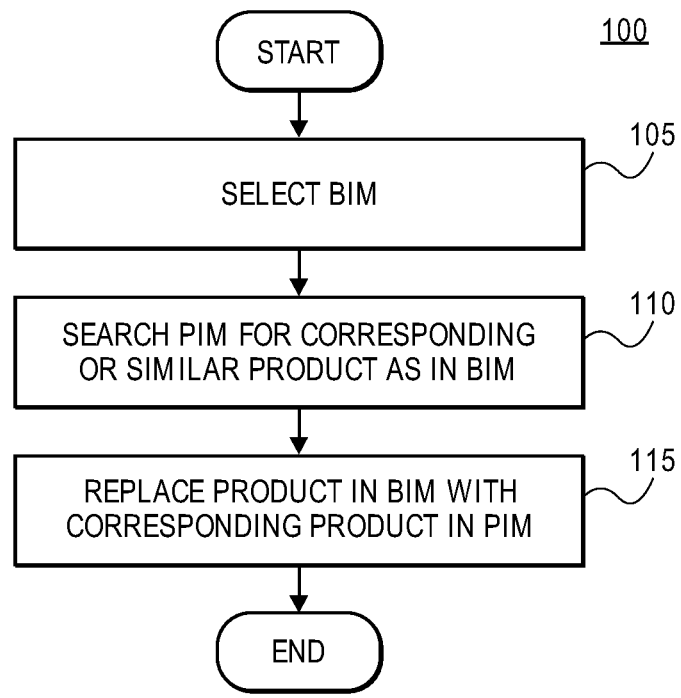
FIG. 1 is a flow chart according to an embodiment of the invention.

Embodiments of the invention solve the above-mentioned problem of determining if a building can be built using a defined set of off-site components, manufacturing machinery, manufacturing processes, and/or installation processes within a set of tolerances such as price, time, and/or energy use. As an example of the complexity of this problem, note first the complexities of computerized manufacturing (e.g., using Computer Numerical Control (CNC) automation) and second, the complexities of off-site construction.

First, an example of the complexities of CNC fabrication, when a floor is specified by an architect, manufacturing of the floor then proceeds through many steps: an internal structure of dimensional lumber is selected, as well as brackets to connect wood pieces together; CNC cut paths are determined for each CNC machine to execute; a camera and robotic arm identifies dimensional lumber and feeds it into a CNC machine; one or more CNC machines execute a series of cuts, drilling, and laminating; a CNC conveyor moves the element for loading; the element is transported to a job site; and finally, the element is installed in the building. While it may be possible to intuit the certain aspects of a construction process through experience, the particular limitations and efficiencies of every CNC machine are beyond "intuitive" grasp. When an architect pictures cutting dimensional lumber in half by hand, this is easy to intuit. However, this is not the case for a particular wood cutting model (e.g. Model 43CS-99-2SOCN), which is based on many criteria (the amperage load values of the motors, rotational axis ranges, saw size, etc.).

Second, examples describing the complexity of off-site (or prefabricated) construction. With off-site fabrication, the designer must understand a catalog of thousands of pre-fabricated building components, each with generative design rules that cause the catalog element to change its size and performance. When designing a wall, it is not simply a wall, but the aggregate of a selection of wall products, each with specific dimensions, costs, and mating rules which determine which wall products, floor products, roof products, may join with the wall. Thus, prior to product selection, a design professional does not know which products must be selected to achieve the design intent of their BIM. As only a building made completely from products can be built, knowing these products is a requirement to know constructability. Additionally, many products can be configured after they are selected, changing their size, geometry, weight, and other performance criteria. The configuration and adoption of a product to its context and the parameters of a designer, according to embodiments of the invention, is referred to herein as "generative design". Generative design greatly increases the number of decisions, or the "search space" of available products.

The combination of a large off-site product catalog with generative design parameters, with the numerous and un-intuitive constraints of CNC manufacturing, makes this problem intractable by manual means alone.

Embodiments of the invention solve the problem in several ways. One embodiment captures the generative design rules about off-site fabricated products into a Product Information System (PIM) system database. One embodiment captures the manufacturing constraints and limitations of the manufacturing processes in the PIM system. One embodiment captures the transportation constraints and limitations of the product's transportation from site of initial manufacturing and assembly to the final installation site (i.e., the construction site). One embodiment captures the installation constraints and limitations of the product's installation. One embodiment is given an input model to check which is not made exclusively of products in the PIM system. It determines a set of products, along with their generative design parameters, which when assembled with their rules and parameters, re-create the original model within a particular tolerance. Alternately, if a user provides a model with the products and parameters pre-selected, the system uses this user-provided model. One embodiment checks whether the selected products and their parameters, if they were manufactured using the stored set of manufacturing processes, could be manufactured. One embodiment, using a Product Lifecycle Management (PLM) or Enterprise Resource Planning (ERP) system, checks whether the selected products and their parameters can be sourced using the material supply information contained in these systems. One embodiment checks whether the selected products and their parameters, if they were transported with the stored set of transportation processes, could be transported from the manufacturing location to the construction site. One embodiment checks whether the selected products and their parameters, if they were installed with the stored set of installation processes, could be installed. If the system is working from a model with the products and processes defined, it stops, and returns an aggregate model check result. If the process is starting with a model without products and parameters selected, it searches through an optimized iterative process to find a set of products and parameters that will satisfy the manufacturing, sourcing, transportation, and installation criteria. This is accomplished by limiting the set of total feasible solutions to be less than a brute force method.

Embodiments of the invention are unique for several reasons. For example, the embodiments select a set of manufactured building components to increase the level of detail in a BIM. This is greatly beyond the scope of products such as MiTek and SDS/2, which only focus on a small subset of building componentry. Further, embodiments of the invention evaluate the selection of building components for not only for manufacturing constraints (like SDS/2) or product constraints (like MiTek), but for transportation and installation constrains as well. The selection of a product is not limited to a single domain, but must be appropriate for all parts of the building construction process. Embodiments of the invention further provide a buildability check of from a low level of detail (LOD) model. Other systems such as the Autodesk Model Checker and Autodesk Model Review require the input BIM to be fully qualified before it can provide a check. Embodiments of the invention work from a pre-BIM conceptual geometry model.

Embodiments of the invention store generative design rules in a combination of an Enterprise Resource Planning System (ERP) and/or a Product Information Management System (PIM) and/or a Relational Database Management System. The data may be contained inside of one or more of these systems, and one embodiment retrieves the required information from each system and merges the information together into a single data stream. This database or databases may be used in conjunction with an ERP system storing material and supply chain information. This material supply information is used later for a material sourcing check, according to one embodiment.

Embodiments of the invention store manufacturing constraints. These constraints are the limits or requirements of the manufacturing process in the factory, including: manual "by-hand" manufacturing limitations, or computer numerical control (CNC) manufacturing limitations. For example, an embodiment may store the maximum length of wood that can be processed by the manufacturing plant, or the range of angles at which the wood can be cut. Manufacturing constraints may include aspects such as supply chain limitations: whether or not the captured supply chains will be able to supply the required amount of inventory documented in the BIM, to the location designated, by the time required.

Embodiments of the invention store transportation constraints for the set of selected products. These constraints are the limits or requirements to transport a manufactured item from the location of manufacturing to the location of installation. For example, a product may have to be stored and transported vertically, rather than being stored and/or transported horizontally. An embodiment may also store the available means and methods for transportation, such as the available trucks inventory, the descriptions (such as bed size), and the transportation limitations: maximum length, width, and height of an object that will be transported by a semi-trailer truck. In this case, the information is stored in the ERP and/or the PIM system at or before this step.

Embodiments of the invention store installation constraints. These constraints are the limits and requirements to install the product on a job site. These constraints can include requirements for a crane or other device to lift the product into place; or these constraints can describe the installation sequence for a product (e.g. carpet panels must be installed in linear strips starting from the far side of a room to the entrance door); or any access points that are required, such as clearance for a wrench to tighten attachment bolts.

Embodiments of the invention may find a set of products and their parameters that create the input model using the stored generative design rules. Such an embodiment has several sub-tasks, First, one embodiment categorizes the geometry of the model according to a set of building component categories, such as walls, floors, and windows. Next the embodiment selects from a catalog of products stored in the ERP and/or PIM databases products that have similar geometries to the input model, within a certain tolerance. Note that the tolerance may be evaluated only with regard to one "face" of the product. For example, if the input model does not contain walls with any thickness (i.e. the walls are a single surface), one embodiment fits a wall product to the exterior surface only. Next, one embodiment confirms that the selected products can mate (connect to) to the surrounding products. These connection rules are contained in the ERP and/or PIM databases.

Embodiments of the invention check whether the configured products and can be manufactured using the stored constraints. For example, one embodiment checks whether a product which needs to be cut, and configured with generative design rules, will fit into the CNC cutting machine in the factory. The specific steps of manufacturing (i.e., what machine[s] must be used to manufacture the product) are stored in the ERP and/or PIM database.

Embodiments of the invention check whether the configured product can be manufacturing using the existing or projected inventory of materials. For example, if a cabinet product is being checked, the process will check (1) that there is a supplier available for the required material and (2) that the required material exists in inventory or can be purchased from the supplier.

Embodiments of the invention check whether the configured product can be transported from the location of manufacture (or warehousing), to the location of installation. This factors in any requirements stored in the ERP and/or PIM databases, such as: transportation size, including packaging, and transportation orientation. These are compared with stored transportation methods and inventories, such as the number of available flat-bed trucks, and their transportation ranges.

Embodiments of the invention check whether the configured product can be installed within the context geometry of the model. Using the previous example of the bolt-clearance, this step checks that there is sufficient clearance around the attachment points of a product to allow a worker to tighten the bolts with a wrench. The specific work steps required to install a product are contained in the ERP and/or PIM databases.

In one embodiment, if the parameters are specified, the embodiment provides an aggregate report about whether the object can be manufactured. This can be presented in many forms, depending on the level of detail required by the user. For instance, it can give a single "Yes/No" binary response about manufacturability, or it can give a detailed report about each building component, with the reasons why manufacturability is not possible. Typically, this information is displayed using colors (color coding) overlaid onto the building components.

When an embodiment of the invention is selecting a building part, and the part selection fails, the embodiment selects alternate parts in an optimized iterative process to find parts that would make manufacturing, transportation, installation, or any other constraints possible. In other words, after selecting a set of products from a catalog out of which to create a building project, the embodiment does not simply stop when the selected products generate an un-manufacturable, un-transportable, or un-installable building. The embodiment chooses alternate products that match the building form within the specified tolerance, and re-checks these products. Embodiments of the invention use a variety of algorithms to improve the speed of this iterative search, including genetic algorithms, ant-colony optimization, and bee-colony optimization.

Figure 3:
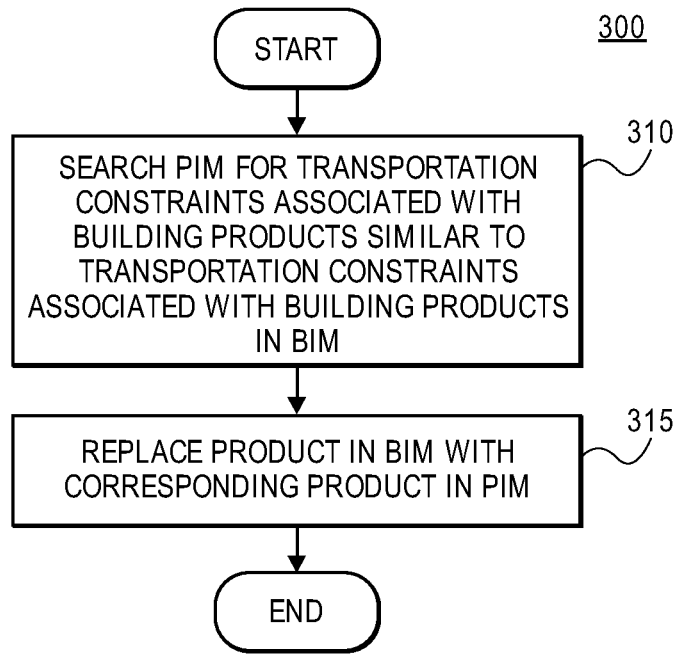
FIG. 3 is a flow chart according to an embodiment of the invention.

With reference to FIGS. 1 and 3 an embodiment of the invention includes a method 100 executed by a computer system to determine feasibility of one or more aspects of a building project, taking into consideration factors such as off-site manufacturing processes, product availability, transportation processes, installation processes, operational/functionality aspects of the building project, occupancy experience, etc., within a set of one or more selected tolerances such as price, time, sustainability, reliability, quality, durability, etc.

In one embodiment, a processor 362 executes software instructions 322 to perform the method. A storage device 331 accessible by the processor stores a database, and the database, in one embodiment, stores therein information regarding a building products information model (PIM), the PIM comprising a number of building products that are available for installation and/or meet certain criteria for inclusion in the building project. In other words, the building products in the PIM are understood or recognized as being feasible for inclusion in the building project. In one embodiment, the database further stores therein a building information model (BIM) for the building project, the BIM comprising another number of building products that may or may not be available or feasible for installation and/or may or may not meet certain criteria for inclusion in the building project. In other words, the building products in the BIM are not necessarily understood or recognized as being feasible for inclusion in the building project. A BIM in one embodiment is a digital representation of a 3D-based model of and corresponding process for a facility. The BIM gives architecture, engineering, and construction (AEC) professionals insight and tools to plan, design, construct, and manage the physical and functional characteristics of the facility, whether a building, an infrastructure project, or a place.

Building information modeling (BIM) involves representing a design as one or more combinations of objects, which may be vague and undefined, generic or product-specific, solid shapes, or void-space oriented (like the shape of a room), that include their geometry, relations and attributes.

BIM-based design tools allow creating different views for a building project for drawing production and other uses. These different views are automatically consistent, being based on a single definition of each object instance. BIM based software may also defines objects parametrically. That is, the objects are defined as parameters and relations to other objects, so that if a related object is amended, dependent ones will automatically also change. Each BIM object can include attributes for selecting and ordering them automatically, providing cost estimates, and for material tracking and ordering, among other attributes.

In one embodiment, a user interface (UI) 310 receives input from a user and transmits output to the user according to software instructions 322 executed by the processor 362. In particular, the software instructions, when executed by the processor, cause the computer system to receive user input at 105 from the user via the UI to select the BIM.

The software instructions then cause the system to search the PIM at 110 for building products therein that are the same as, similar to, or an adequate substitute for, one or more of the building products in the BIM. If the search of the PIM is successful, that is, if one or more products in the PIM is found that is the same as, similar to, or an adequate substitute for, the one or more of the building products in the BIM, the software instructions cause the system to replace the one or more the building products in the BIM with the similar/substitute building products in the PIM. Alternatively, in one embodiment, if the one or more products in the PIM are the same as, or substantially identical to, the one or more of the building products in the BIM, then there may not be a need to actually replace the one or more building products in the BIM with the same one or more building products in the PIM. Rather, the software instructions may case the system to identify the one or more building products in the BIM as having passed a feasibility check or otherwise mark the one or more building products in the BIM as validated for inclusion in the building project.

Figure 2:
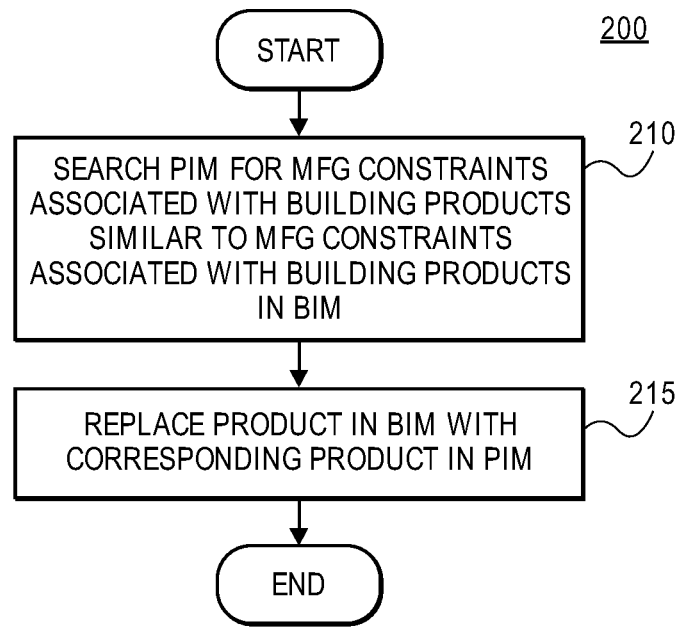
FIG. 2 is a flow chart according to an embodiment of the invention.

With reference to FIG. 2, in one embodiment of the invention 200, the PIM further comprises a number of manufacturing constraints associated with the building products in the PIM, and the BIM likewise comprises manufacturing constraints associated with its corresponding building products. In such an embodiment, the software instructions then cause the system to search the PIM at 210 for one or more manufacturing constraints associated with its building products that are similar to or an acceptable substitute for one or more manufacturing constraints associated with building products in the BIM. If the search of the PIM is successful, that is, if one or more manufacturing constraints associated with one or more building products in the PIM is found that is similar to or an acceptable replacement for one or more manufacturing constraints associated with corresponding building products in the BIM, the software instructions cause the system to replace at 215 the one or more the building products in the BIM with the similar/substitute building products in the PIM. In one embodiment, when one or more manufacturing constraints associated with building products in the PIM is identical or substantially identical to the one or more manufacturing constraints associated with the corresponding building products in the BIM, no replacement necessarily need occur. In such case, the software instructions may cause the system to note or otherwise mark the products in the BIM as verified, indicating the products are feasible, from a manufacturing perspective, for inclusion in the building project, having been searched and found in the PIM.

With reference to FIG. 3, in one embodiment of the invention 300, the PIM further comprises a number of transportation constraints associated with the building products in the PIM, and the BIM likewise comprises transportation constraints associated with its corresponding building products. In such an embodiment, the software instructions then cause the system to search the PIM at 310 for one or more transportation constraints associated with its building products that are similar to or an acceptable substitute for one or more transportation constraints associated with building products in the BIM. If the search of the PIM is successful, that is, if one or more transportation constraints associated with one or more building products in the PIM is found that is similar to or an acceptable replacement for one or more transportation constraints associated with corresponding building products in the BIM, the software instructions cause the system to replace at 315 the one or more the building products in the BIM with the similar/substitute building products in the PIM. In one embodiment, when one or more transportation constraints associated with building products in the PIM is identical or substantially identical to the one or more transportation constraints associated with the corresponding building products in the BIM, no replacement necessarily need occur. In such case, the software instructions may cause the system to note or otherwise mark the products in the BIM as verified, indicating the products are feasible, from a transportation perspective, for inclusion in the building project, having been searched and found in the PIM.

Figure 4:
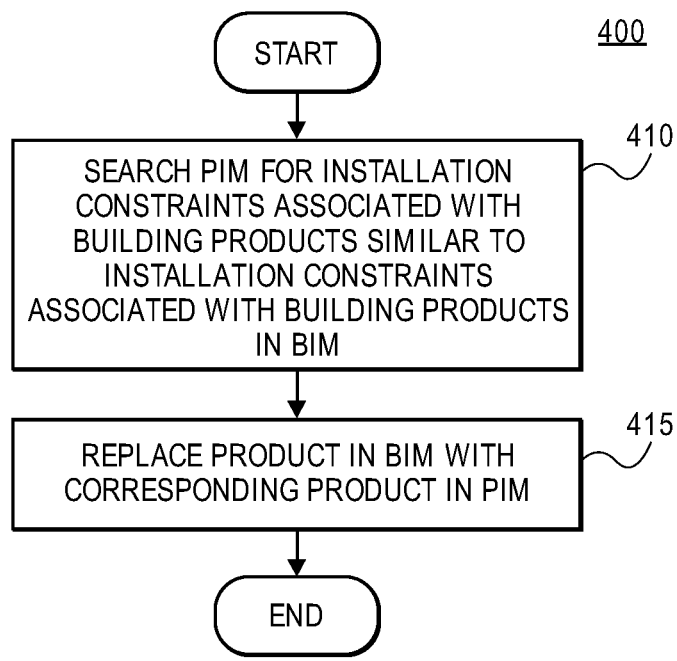
FIG. 4 is a flow chart according to an embodiment of the invention.

With reference to FIG. 4, in one embodiment of the invention 400, the PIM further comprises a number of installation constraints associated with the building products in the PIM, and the BIM likewise comprises installation constraints associated with its corresponding building products. In such an embodiment, the software instructions then cause the system to search the PIM at 410 for one or more installation constraints associated with its building products that are similar to or an acceptable substitute for one or more installation constraints associated with building products in the BIM. If the search of the PIM is successful, that is, if one or more installation constraints associated with one or more building products in the PIM is found that is similar to or an acceptable replacement for one or more installation constraints associated with corresponding building products in the BIM, the software instructions cause the system to replace at 415 the one or more the building products in the BIM with the similar/substitute building products in the PIM. In one embodiment, when one or more installation constraints associated with building products in the PIM is identical or substantially identical to the one or more installation constraints associated with the corresponding building products in the BIM, no replacement necessarily need occur. In such case, the software instructions may cause the system to note or otherwise mark the products in the BIM as verified, indicating the products are feasible, from an installation perspective, for inclusion in the building project, having been searched and found in the PIM.

Figure 5:
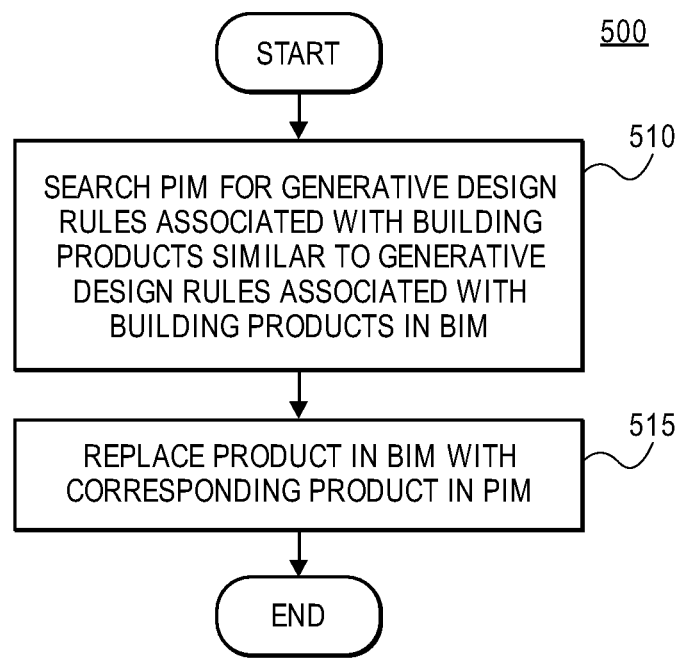
FIG. 5 is a flow chart according to an embodiment of the invention.

With reference to FIG. 5, in one embodiment of the invention 500, the PIM further comprises a number of generative design rules associated with the building products in the PIM, and the BIM likewise comprises generative design rules associated with its corresponding building products. In such an embodiment, the software instructions then cause the system to search the PIM at 510 for one or more generative design rules associated with its building products that are similar to or an acceptable substitute for one or more generative design rules associated with building products in the BIM. If the search of the PIM is successful, that is, if one or more generative design rules associated with one or more building products in the PIM is found that is similar to or an acceptable replacement for one or more generative design rules associated with corresponding building products in the BIM, the software instructions cause the system to replace at 515 the one or more the building products in the BIM with the similar/substitute building products in the PIM. In one embodiment, when one or more generative design rules associated with building products in the PIM is identical or substantially identical to the one or more generative design rules associated with the corresponding building products in the BIM, no replacement necessarily need occur. In such case, the software instructions may cause the system to note or otherwise mark the products in the BIM as verified, indicating the products are feasible, from a generative design rules perspective, for inclusion in the building project, having been searched and found in the PIM.

Figure 6:
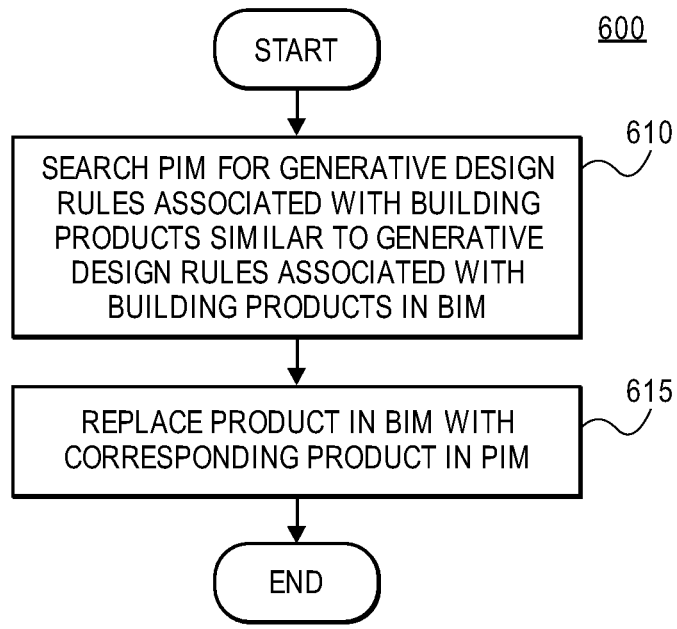
FIG. 6 is a flow chart according to an embodiment of the invention.

With reference to FIG. 6, in one embodiment of the invention 600, the PIM further comprises a number of supply constraints associated with the building products in the PIM, and the BIM likewise comprises supply constraints associated with its corresponding building products. In such an embodiment, the software instructions then cause the system to search the PIM at 610 for one or more supply constraints associated with its building products that are similar to or an acceptable substitute for one or more supply constraints associated with building products in the BIM. If the search of the PIM is successful, that is, if one or more supply constraints associated with one or more building products in the PIM is found that is similar to or an acceptable replacement for one or supply constraints associated with corresponding building products in the BIM, the software instructions cause the system to replace at 615 the one or more the building products in the BIM with the similar/substitute building products in the PIM. In one embodiment, when one or more supply constraints associated with building products in the PIM is identical or substantially identical to the one or more supply constraints associated with the corresponding building products in the BIM, no replacement necessarily need occur. In such case, the software instructions may cause the system to note or otherwise mark the products in the BIM as verified, indicating the products are feasible, from a supply constraints perspective, for inclusion in the building project, having been searched and found in the PIM.

In the above described embodiment, the one or more building products in the PIM that replace one or more of the building products in the BIM might vary with respect to the one or more building products in the BIM within a selected tolerance, such as such as price, time, sustainability, reliability, quality, durability of the building product.

In one embodiment of the invention, the system for determining feasibility of one or more aspects of a building project contemplates a BIM that is not fully annotated. Indeed, the BIM may be empty of information on building products and associated attributes, or substantially so. It is contemplated that the BIM may not have information regarding some or all of the building products that may be used in a building project and instead that information needs to be added to the BIM. According to such an embodiment, the processor 362 executes software instructions 322 to perform the following method.

A storage device 331 accessible by the processor stores a database, and the database, in one embodiment, stores therein information regarding a building products information model (PIM), the PIM comprising a number of building products that are available for installation and/or meet certain criteria for inclusion in the building project. In other words, the building products in the PIM are understood or recognized as being feasible for inclusion in the building project. In one embodiment, the database further stores therein a building information model (BIM) for the building project, the BIM comprising few or no building products and/or associated criteria for inclusion in a building project.

Figure 7:
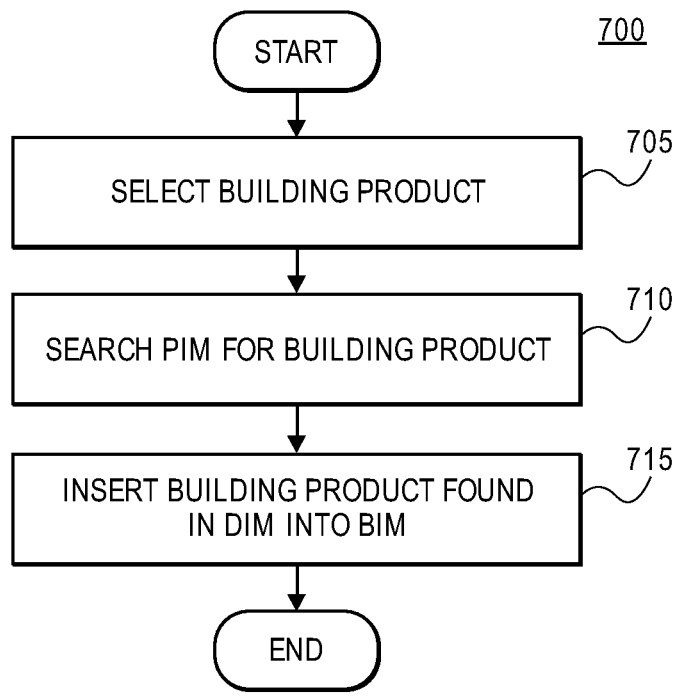
FIG. 7 is a flow chart according to an embodiment of the invention.

With reference to FIG. 7, in one embodiment 700, a user interface (UI) 310 receives input from a user and transmits output to the user according to software instructions 322 executed by the processor 362. In particular, the software instructions, when executed by the processor, cause the computer system to receive user input at 705 from the user via the UI to select a building product to input into the BIM as one of the number of building products to be stored in the BIM. The software instructions then cause the system to search the PIM at 710 for one or more building products therein that are the same as, similar to, or an acceptable substitute for, the selected building product. If the search of the PIM is successful, that is, if one or more products in the PIM is found that is the same as, similar to, or an adequate substitute for, the selected building product, the software instructions cause the system to insert the one or more building products in the PIM into the BIM at 715.

Figure 8:
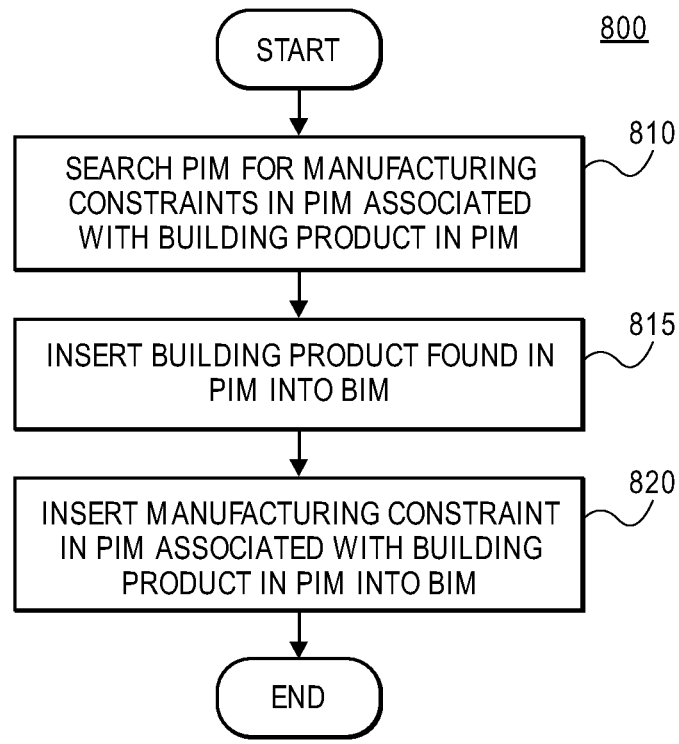
FIG. 8 is a flow chart according to an embodiment of the invention.

With reference to FIG. 8, in one embodiment of the invention 800, the PIM further comprises a number of manufacturing constraints associated with its building products. The BIM, likewise, is to comprise a number of manufacturing constraints associated its building products. In such an embodiment, the software instructions then cause the system to search the PIM at 810 for one or more manufacturing constraints in the PIM associated with the one or more building products in the PIM that are found to be the same as, similar to, or an adequate substitute for, the selected building product. If the search of the PIM is successful, the software instructions cause the system to input at 815 the one or more of the building products in the PIM into the BIM as the one or more of the building products in the BIM. Furthermore, if the search of the PIM is successful, the software instructions cause the system to input at 820 the one or more manufacturing constraints in the PIM associated with the one or more building products in the PIM that are found to be the same as, similar to, or an adequate substitute for, the selected building product into the BIM as the one or more manufacturing constraints associated with the building products in the BIM.

Figure 9:
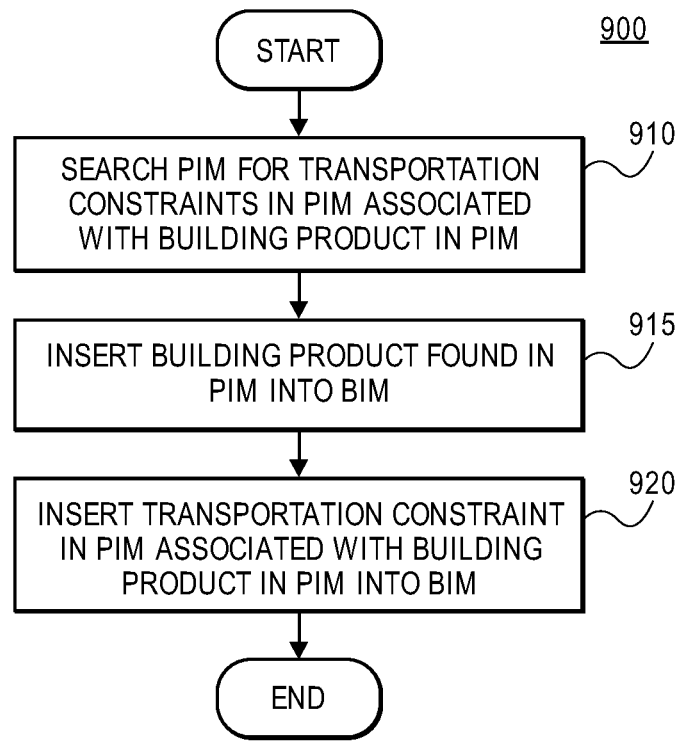
FIG. 9 is a flow chart according to an embodiment of the invention.

With reference to FIG. 9, in one embodiment of the invention 900, the PIM further comprises a number of transportation constraints associated with its building products. The BIM, likewise, is to comprise a number of transportation constraints associated its building products. In such an embodiment, the software instructions then cause the system to search the PIM at 910 for one or more transportation constraints in the PIM associated with the one or more building products in the PIM that are found to be the same as, similar to, or an adequate substitute for, the selected building product. If the search of the PIM is successful, the software instructions cause the system to input at 915 the one or more of the building products in the PIM into the BIM as the one or more of the building products in the BIM. Furthermore, if the search of the PIM is successful, the software instructions cause the system to input at 920 the one or more transportation constraints in the PIM associated with the one or more building products in the PIM that are found to be the same as, similar to, or an adequate substitute for, the selected building product into the BIM as the one or more transportation constraints associated with the building products in the BIM.

Figure 10:
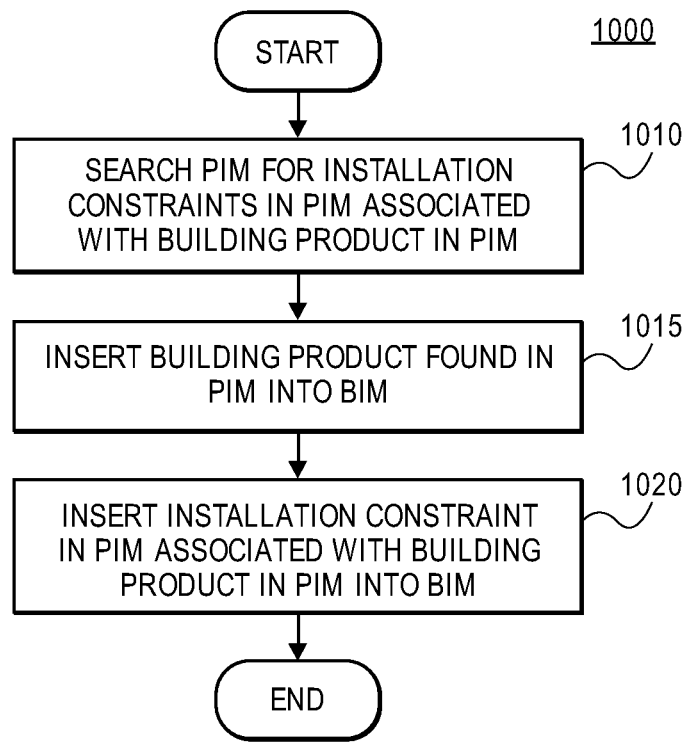
FIG. 10 is a flow chart according to an embodiment of the invention.

With reference to FIG. 10, in one embodiment of the invention 1000, the PIM further comprises a number of installation constraints associated with its building products. The BIM, likewise, is to comprise a number of installation constraints associated its building products. In such an embodiment, the software instructions then cause the system to search the PIM at 1010 for one or more installation constraints in the PIM associated with the one or more building products in the PIM that are found to be the same as, similar to, or an adequate substitute for, the selected building product. If the search of the PIM is successful, the software instructions cause the system to input at 1015 the one or more of the building products in the PIM into the BIM as the one or more the building products in the BIM. Furthermore, if the search of the PIM is successful, the software instructions cause the system to input at 1020 the one or more installation constraints in the PIM associated with the one or more building products in the PIM that are found to be the same as, similar to, or an adequate substitute for, the selected building product into the BIM as the one or more of installation constraints associated with the building products in the BIM.

Figure 11:
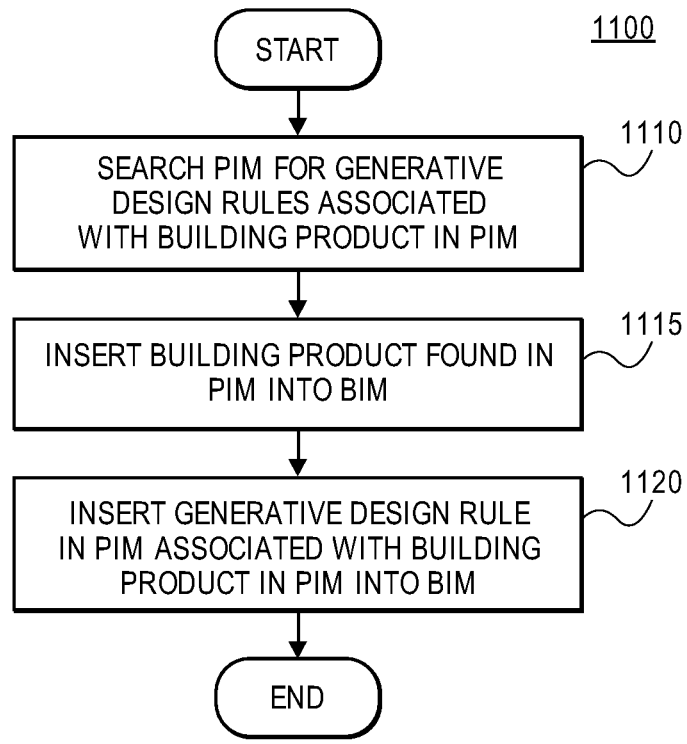
FIG. 11 is a flow chart according to an embodiment of the invention.

With reference to FIG. 11, in one embodiment of the invention 1100, the PIM further comprises a number of generative design rules associated with its building products. The BIM, likewise, is to comprise a number of generative design rules associated its building products. In such an embodiment, the software instructions then cause the system to search the PIM at 1110 for one or more generative design rules in the PIM associated with the one or more building products in the PIM that are found to be the same as, similar to, or an adequate substitute for, the selected building product. If the search of the PIM is successful, the software instructions cause the system to input at 1115 the one or more of the building products in the PIM into the BIM as the one or more of the building products in the BIM. Furthermore, if the search of the PIM is successful, the software instructions cause the system to input at 1120 the one or more generative design rules in the PIM associated with the one or more building products in the PIM that are found to be the same as, similar to, or an adequate substitute for, the selected building product into the BIM as the one or more generative design rules associated with the building products in the BIM.

Figure 12:
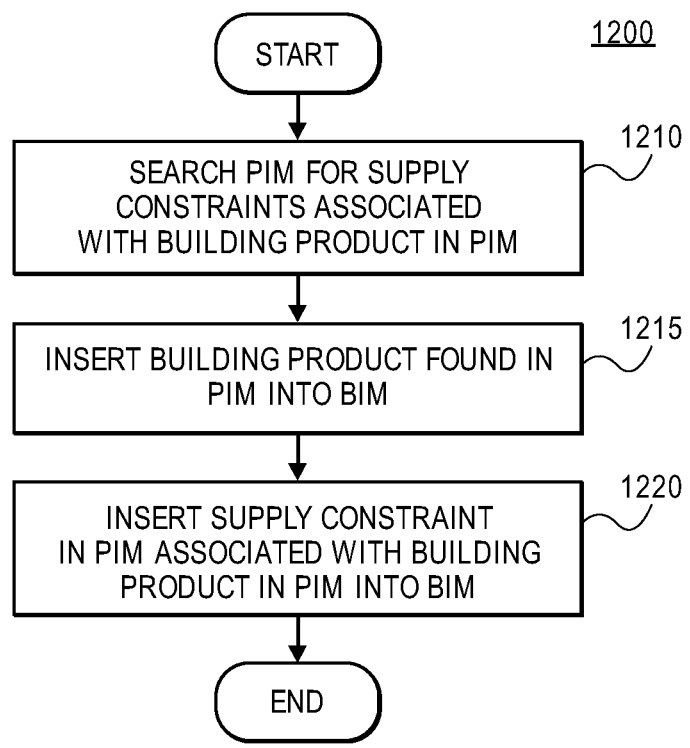
FIG. 12 is a flow chart according to an embodiment of the invention.

With reference to FIG. 12, in one embodiment of the invention 1200, the PIM further comprises a number of supply constraints associated with its building products. The BIM, likewise, is to comprise a number of supply constraints associated its building products. In such an embodiment, the software instructions then cause the system to search the PIM at 1210 for one or more supply constraints in the PIM associated with the one or more building products in the PIM that are found to be the same as, similar to, or an adequate substitute for, the selected building product. If the search of the PIM is successful, the software instructions cause the system to input at 1215 the one or more of the building products in the PIM into the BIM as the one or more of the building products in the BIM. Furthermore, if the search of the PIM is successful, the software instructions cause the system to input at 1220 the one or more supply constraints in the PIM associated with the one or more building products in the PIM that are found to be the same as, similar to, or an adequate substitute for, the selected building product into the BIM as the one or more supply constraints associated with the building products in the BIM.

Figure 13:
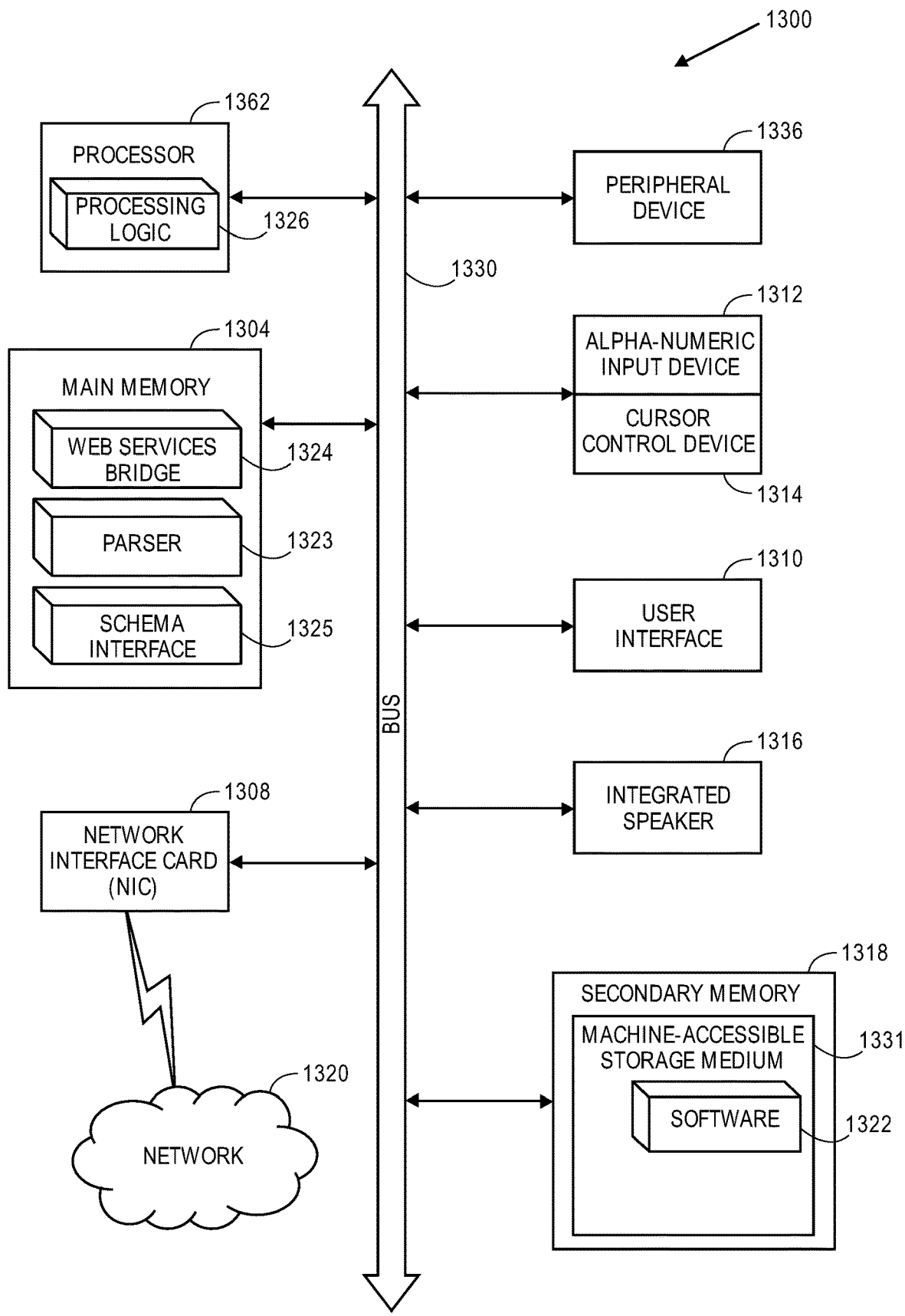
FIG. 13 illustrates a diagrammatic representation of a machine in the exemplary form of a computer system, in accordance with one embodiment of the invention.

FIG. 13 illustrates a diagrammatic representation of a machine 1300 in the exemplary form of a computer system, in accordance with one embodiment, within which a set of instructions, for causing the machine/computer system 1300 to perform any one or more of the methodologies discussed herein, may be executed. In alternative embodiments, the machine may be connected (e.g., networked) to other machines in a Local Area Network (LAN), an intranet, an extranet, or the public Internet. The machine may operate in the capacity of a server or a client machine in a client-server network environment, as a peer machine in a peer-to-peer (or distributed) network environment, as a server or series of servers within an on-demand service environment. Certain embodiments of the machine may be in the form of a personal computer (PC), a tablet PC, a set-top box (STB), a Personal Digital Assistant (PDA), a cellular telephone, a web appliance, a server, a network router, switch or bridge, computing system, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc., static memory such as flash memory, static random access memory (SRAM), volatile but high-data rate RAM, etc.), and a secondary memory 1318 (e.g., a persistent storage device including hard disk drives and a persistent database), which communicate with each other via a bus 1330. Main memory 1304 includes a web services bridge 1324 and a schema interface 1325 and a parser 1323 by which to communicate with another web services environment, retrieve, and parse a schema to identify methods provided by the web service at the other web services environment in accordance with described embodiments. Main memory 1304 and its sub-elements are operable in conjunction with processing logic 1326 and processor 1302 to perform the methodologies discussed herein.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations and functionality which is discussed herein.

The computer system 1300 may further include a network interface card 1308. The computer system 1300 also may include a user interface 1310 (such as a video display unit, a liquid crystal display, etc.), an alphanumeric input device 1312 (e.g., a keyboard), a cursor control device 1314 (e.g., a mouse), and a signal generation device 1316 (e.g., an integrated speaker). The computer system 1300 may further include peripheral device 1336 (e.g., wireless or wired communication devices, memory devices, storage devices, audio processing devices, video processing devices, etc.).

The secondary memory 1318 may include a non-transitory machine-readable storage medium or a non-transitory computer readable storage medium or a non-transitory machine-accessible storage medium 1318 on which is stored one or more sets of instructions (e.g., software 822) embodying any one or more of the methodologies or functions described herein. The software 822 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface card 1308.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims that follow. Features of the disclosed embodiments can be combined and rearranged in various ways.

What is claimed is:

1. A system for determining feasibility of one or more aspects of a building project comprising:
   a processor to execute software instructions;
   a storage device accessible by the processor in which to store a database, the database to store therein a building products information model (PIM) comprising a first plurality of building products, the database further to store therein a building information model (BIM) for the building project, the BIM comprising a second plurality of building products;
   a user interface (UI) via which to receive input from a user and transmit output to the user according to software instructions executed by the processor; and
   software instructions that when executed by the processor cause the system to:
   receive input from the user via the UI to select the BIM;
   search the PIM for one or more of the first plurality of building products that is at least similar to, or a replacement that meets a constraint of, at least one of the second plurality of building products in the BIM; and
   replace the at least one of the second plurality of building products in the BIM with the one or more of the first plurality of building products in the PIM that is the replacement for the at least one of the second plurality of building products in the BIM, when the search of the PIM finds the one or more of the first plurality of building products in the PIM is not at least similar to, but the replacement for, the at least one of the second plurality of building products in the BIM, and;
   validate as feasible the at least one of the second plurality of building products in the BIM when the search of the PIM finds the one or more of the first plurality of building products in the PIM is at least similar to the at least one of the second plurality of building products in the BIM.

2. The system of claim 1, wherein the PIM further comprises a first plurality of manufacturing constraints associated with the first plurality of building products, wherein the BIM further comprises a second plurality of manufacturing constraints associated with the second plurality of building products, and wherein the system further comprises software instructions that when executed by the processor cause the system to:
   search the PIM for at least one of the first plurality of manufacturing constraints in the PIM associated with the first plurality of building products that is at least similar to, or a replacement that meets, at least one of the second plurality of manufacturing constraints associated with the second plurality of building products in the BIM; and
   replace the at least one of the second plurality of building products in the BIM with one or more of the first plurality of building products in the PIM for which the at least one of the first plurality of manufacturing constraints in the PIM associated with the first plurality of building products is the replacement for the at least one of the second plurality of manufacturing constraints associated with the second plurality of building products in the BIM when the search of the PIM for at least one of the first plurality of manufacturing constraints finds the at least one the first plurality of manufacturing constraints in the PIM is not at least similar to, but the replacement for, the at least one of the second plurality of manufacturing constraints in the BIM; and,
   validate as feasible the at least one of the second plurality of building products in the BIM when the search of the PIM for at least one of the first plurality of manufacturing constraints finds the at least one or more of the first plurality of manufacturing constraints in the PIM is at least similar to the at least one or more of the second plurality of manufacturing constraints in the BIM.

3. The system of claim 1, wherein the PIM further comprises a first plurality of transportation constraints associated with the first plurality of building products, wherein the BIM further comprises a second plurality of transportation constraints associated with the second plurality of building products, and wherein the system further comprises software instructions that when executed by the processor cause the system to:
   search the PIM for at least one of the first plurality of transportation constraints in the PIM associated with the first plurality of building products that is at least similar to, or a replacement that meets, at least one of the second plurality of transportation constraints associated with the second plurality of building products in the BIM; and
   replace the at least one of the second plurality of building products in the BIM with one or more of the first plurality of building products in the PIM for which the at least one of the first plurality of transportation constraints in the PIM associated with the first plurality of building products is the replacement for the at least one of the second plurality of transportation constraints associated with the second plurality of building products in the BIM when the search of the PIM for at least one of the first plurality of transportation constraints finds the at least one or more of the first plurality of transportation constraints in the PIM is not at least similar to, but the replacement for, the at least one or more of the second plurality of transportation constraints in the BIM; and,
   validate as feasible the at least one of the second plurality of building products in the BIM when the search of the PIM for at least one of the first plurality of transportation constraints finds the at least one or more of the first plurality of transportation constraints in the PIM is at least similar to the at least one or more of the second plurality of transportation constraints in the BIM.

4. The system of claim 1, wherein the PIM further comprises a first plurality of installation constraints associated with the first plurality of building products, wherein the BIM further comprises a second plurality of installation constraints associated with the second plurality of building products, and wherein the system further comprises software instructions that when executed by the processor cause the system to:
  search the PIM for at least one of the first plurality of installation constraints in the PIM associated with the first plurality of building products that is at least similar to, or a replacement that meets, at least one of the second plurality of installation constraints associated with the second plurality of building products in the BIM; and
  replace the at least one of the second plurality of building products in the BIM with one or more of the first plurality of building products in the PIM
  for which the at least one of the first plurality of installation constraints in the PIM associated with the first plurality of building products is the replacement for the at least one of the second plurality of installation constraints associated with the second plurality of building products in the BIM when the search of the PIM for at least one of the first plurality of installation constraints finds the at least one or more of the first plurality of installation constraints in the PIM is not at least similar to, but the replacement for, the at least one or more of the second plurality of installation constraints in the BIM; and,
  validate as feasible the at least one of the second plurality of building products in the BIM when the search of the PIM for at least one of the first plurality of installation constraints finds the at least one or more of the first plurality of installation constraints in the PIM is at least similar to the at least one or more of the second plurality of installation constraints in the BIM.

5. The system of claim 1, wherein the PIM further comprises a first plurality of generative design rules associated with the first plurality of building products, wherein the BIM further comprises a second plurality of generative design rules associated with the second plurality of building products, and wherein the system further comprises software instructions that when executed by the processor cause the system to:
  search the PIM for at least one of the first plurality of generative design rules in the PIM associated with the first plurality of building products that is at least similar to, or a replacement that meets, at least one of the second plurality of generative design rules associated with the second plurality of building products in the BIM; and
  replace the at least one of the second plurality of building products in the BIM with one or more of the first plurality of building products in the PIM
  for which the at least one of the first plurality of generative design rules in the PIM associated with the first plurality of building products is the replacement for the at least one of the second plurality of generative design rules associated with the second plurality of building products in the BIM when the search of the PIM for at least one of the first plurality of generative design rules finds the at least one or more of the first plurality of generative design rules in the PIM is not at least similar to, but the replacement for, the at least one or more of the second plurality of generative design rules in the BIM; and,
  validate as feasible the at least one of the second plurality of building products in the BIM when the search of the PIM for at least one of the first plurality of generative design rules finds the at least one or more of the first plurality of generative design rules in the PIM is at least similar to the at least one or more of the second plurality of generative design rules in the BIM.

6. The system of claim 1, wherein the PIM further comprises a first plurality of supply constraints associated with the first plurality of building products, wherein the BIM further comprises a second plurality of supply constraints associated with the second plurality of building products, and wherein the system further comprises software instructions that when executed by the processor cause the system to:
  search the PIM for at least one of the first plurality of supply constraints in the PIM associated with the first plurality of building products that is at least similar to, or a replacement that meets, at least one of the second plurality of supply constraints associated with the second plurality of building products in the BIM; and
  replace the at least one of the second plurality of building products in the BIM with one or more of the first plurality of building products in the PIM
  for which the at least one of the first plurality of supply constraints in the PIM associated with the first plurality of building products is the replacement for the at least one of the second plurality of supply constraints associated with the second plurality of building products in the BIM when the search of the PIM for at least one of the first plurality of supply constraints finds the at least one or more of the first plurality of supply constraints in the PIM is not at least similar to, but the replacement for, the at least one or more of the second plurality of supply constraints in the BIM; and,
  validate as feasible the at least one of the second plurality of building products in the BIM when the search of the PIM for at least one of the first plurality of supply constraints finds the at least one or more of the first plurality of supply constraints in the PIM is at least similar to the at least one or more of the second plurality of supply constraints in the BIM.

7. The system of claim 1, wherein the one or more of the first plurality of building products in the PIM that replace the at least one of the second plurality of building products in the BIM vary within a selected tolerance with respect to the at least one of the second plurality of building products in the BIM.

8. A system for determining constructability of a building project comprising:
  a processor to execute software instructions;
  a storage device accessible by the processor in which to store a database, the database to store therein a building products information model (PIM), the PIM comprising a first plurality of building products, the database further to store therein a building information model (BIM) for the building project, the BIM to comprise a second plurality of building products selected from the first plurality of building products in the PIM;
  a user interface (UI) via which to receive input from a user and transmit output to a user according to software instructions executed by the processor; and
  software instructions that when executed by the processor cause the system to:

receive input from the user via the UI to select a building product for input into the BIM as one of the second plurality of building products;

search the first plurality of building products in the PIM for one or more of the first plurality of products that is at least similar to, or a replacement that meets, the selected building product; and input one or more of the first plurality of building products in the PIM that is the replacement for the selected building product into the BIM as one or more of the second plurality of building products in the BIM when the search of the PIM finds the one or more of the first plurality of building products in the PIM is not at least similar to, but the replacement for, the selected building product; and, validate as feasible the selected building product when the search of the PIM finds the one or more of the first plurality of building products in the PIM is at least similar to the selected building product.

9. The system of claim 8, wherein the PIM further comprises a first plurality of manufacturing constraints associated with the first plurality of building products, wherein the BIM further to comprise a second plurality of manufacturing constraints associated with the second plurality of building products, and wherein the system further comprises software instructions that when executed by the processor cause the system to:

search the PIM for at least one of the first plurality of manufacturing constraints in the PIM associated with the first plurality of building products that is at least similar to, or a replacement that meets, the selected building product; and wherein the software instructions that when executed by the processor cause the system to input one or more of the first plurality of building products in the PIM that is the replacement for the selected building product into the BIM as the one or more of the second plurality of building products in the BIM when the search of the PIM finds the one or more of the first plurality of building products in the PIM is not at least similar to, but the replacement for, the selected building product, comprise software instructions that when executed by the processor cause the system to:

input the first plurality of manufacturing constraints in the PIM associated with the first plurality of building products into the BIM as the one or more of the second plurality of manufacturing constraints associated with the second plurality of building products in the BIM.

10. The system of claim 8, wherein the PIM further comprises a first plurality of transportation constraints associated with the first plurality of building products, wherein the BIM further to comprise a second plurality of transportation constraints associated with the second plurality of building products, and wherein the system further comprises software instructions that when executed by the processor cause the system to:

search the PIM for at least one of the first plurality of transportation constraints in the PIM associated with the first plurality of building products that is at least similar to, or a replacement that meets, the selected building product; and wherein the software instructions that when executed by the processor cause the system to input one or more of the first plurality of building products in the PIM that is the replacement for the selected building product into the BIM as the one or more of the second plurality of building products in the BIM, when the search of the PIM finds the one or more of the first plurality of building products in the PIM is not at least similar to, but the replacement for, the selected building product, comprise software instructions that when executed by the processor cause the system to:

input the first plurality of transportation constraints in the PIM associated with the first plurality of building products into the BIM as the one or more of the second plurality of transportation constraints associated with the second plurality of building products in the BIM.

11. The system of claim 8, wherein the PIM further comprises a first plurality of installation constraints associated with the first plurality of building products, wherein the BIM further to comprise a second plurality of installation constraints associated with the second plurality of building products, and wherein the system further comprises software instructions that when executed by the processor cause the system to:

search the PIM for at least one of the first plurality of installation constraints in the PIM associated with the first plurality of building products that is at least similar to, or a replacement that meets, the selected building product; and wherein the software instructions that when executed by the processor cause the system to input one or more of the first plurality of building products in the PIM that is the replacement for the selected building product into the BIM as the one or more of the second plurality of building products in the BIM, when the search of the PIM finds the one or more of the first plurality of building products in the PIM is not at least similar to, but the replacement for, the selected building product, comprise software instructions that when executed by the processor cause the system to:

input the first plurality of installation constraints in the PIM associated with the first plurality of building products into the BIM as the one or more of the second plurality of installation constraints associated with the second plurality of building products in the BIM.

12. The system of claim 8, wherein the PIM further comprises a first plurality of generative design rules associated with the first plurality of building products, wherein the BIM further to comprise a second plurality of generative design rules associated with the second plurality of building products, and wherein the system further comprises software instructions that when executed by the processor cause the system to:

search the PIM for at least one of the first plurality of generative design rules in the PIM associated with the first plurality of building products that is at least similar to, or a replacement that meets, the selected building product; and wherein the software instructions that when executed by the processor cause the system to input one or more of the first plurality of building products in the PIM that is the replacement for the selected building product into the BIM as the one or more of the second plurality of building products in the BIM, when the search of the PIM finds the one or more of the first plurality of building products in the PIM is not at least similar to, but the replacement for, the selected building product, comprise software instructions that when executed by the processor cause the system to:

input the first plurality of generative design rules in the PIM associated with the first plurality of building products into the BIM as the one or more of the second plurality of generative design rules associated with the second plurality of building products in the BIM.

13. The system of claim 8, wherein the PIM further comprises a first plurality of supply constraints associated with the first plurality of building products, wherein the BIM further to comprise a second plurality of supply constraints associated with the second plurality of building products, and wherein the system further comprises software instructions that when executed by the processor cause the system to:

search the PIM for at least one of the first plurality of supply constraints in the PIM associated with the first plurality of building products that is at least similar to, or a replacement that meets, the selected building product; and wherein the software instructions that when executed by the processor cause the system to input one or more of the first plurality of building products in the PIM that is the replacement for the selected building product into the BIM as the one or more of the second plurality of building products in the BIM, when the search of the PIM finds the one or more of the first plurality of building products in the PIM is not at least similar to, but the replacement for, the selected building product, comprise software instructions that when executed by the processor cause the system to:

input the first plurality of supply constraints in the PIM associated with the first plurality of building products into the BIM as the one or more of the second plurality of supply constraints associated with the second plurality of building products in the BIM.

* * * * *